United States Patent
Parekh et al.

(10) Patent No.: US 10,505,555 B2
(45) Date of Patent: Dec. 10, 2019

(54) CRYSTAL OSCILLATOR OFFSET TRIM IN A PHASE-LOCKED LOOP

(71) Applicant: TEXAS INSTRUMENTS INCORPORATED, Dallas, TX (US)

(72) Inventors: Sinjeet Dhanvantray Parekh, San Jose, CA (US); Jayawardan Janardhanan, Issaquah, WA (US); Christopher Andrew Schell, Tacoma, WA (US); Arvind Sridhar, Issaquah, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/227,777

(22) Filed: Dec. 20, 2018

(65) Prior Publication Data

US 2019/0288699 A1 Sep. 19, 2019

Related U.S. Application Data

(60) Provisional application No. 62/642,039, filed on Mar. 13, 2018.

(51) Int. Cl.
*H03L 7/06* (2006.01)
*H03L 7/08* (2006.01)
(Continued)

(52) U.S. Cl.
CPC ............ *H03L 7/0992* (2013.01); *H03L 7/093* (2013.01)

(58) Field of Classification Search
CPC .............................. H03L 7/0992; H03L 7/093
See application file for complete search history.

(56) References Cited

U.S. PATENT DOCUMENTS 5,200,933 A  4/1993  Thornton et al.
5,304,954 A  4/1994  Saito et al.
(Continued)

FOREIGN PATENT DOCUMENTS

EP  0644657  3/1995
EP  3182592  6/2017
(Continued)

OTHER PUBLICATIONS

Michael H. Perrott, "Tutorial on Digital Phase-Locked Loops;" CICC 2009. Sep. 2009 (118 pgs).
(Continued)

*Primary Examiner* — Kenneth B Wells
(74) *Attorney, Agent, or Firm* — John R. Pessetto; Charles A. Brill; Frank D. Cimino

(57) ABSTRACT

A phase-locked loop (PLL) includes a time-to-digital converter (TDC) to receive a reference clock. The PLL also includes a digital loop filter coupled to the TDC. The digital loop filter repeatedly generates frequency control words. An analog phase-locked loop (APLL) includes a programmable frequency divider. A non-volatile memory device stores a value from the digital loop filter. The PLL includes a free-run control circuit. Upon a power-on reset process, the free-run circuit retrieves the value from the non-volatile memory to adjust a divide ratio of the programmable frequency divider based on the retrieved value. Upon a reference clock provided to the TDC, the free-run control circuit continues to adjust the divide ratio of the programmable frequency divider based on both the retrieved value from the non-volatile memory and a current frequency control word from the digital loop filter.

20 Claims, 2 Drawing Sheets

(51) Int. Cl.
*H03L 7/099* (2006.01)
*H03L 7/093* (2006.01)

(56) References Cited

U.S. PATENT DOCUMENTS

| | | | |
|---|---|---|---|
| 5,796,682 | A | 8/1998 | Swapp |
| 5,959,502 | A | 9/1999 | Ovens et al. |
| 6,308,055 | B1 | 10/2001 | Welland et al. |
| 6,310,653 | B1 | 10/2001 | Malcolm, Jr. et al. |
| 6,584,574 | B1 | 6/2003 | Embree |
| 6,597,249 | B2 | 7/2003 | Chien et al. |
| 6,957,711 | B2 | 10/2005 | Jin et al. |
| 7,126,429 | B2 | 10/2006 | Mitric |
| 7,755,439 | B2 * | 7/2010 | Yu ................. H03C 3/0925 331/14 |
| 7,876,136 | B2 | 1/2011 | Ha et al. |
| 8,179,174 | B2 * | 5/2012 | Bunch ............. H03L 7/1976 327/147 |
| 8,368,438 | B2 | 2/2013 | Furuta |
| 9,020,089 | B2 * | 4/2015 | Da Dalt ............ H03L 7/093 327/156 |
| 9,490,820 | B2 * | 11/2016 | Shiozaki ........... H03L 7/0802 |
| 9,634,826 | B1 * | 4/2017 | Park ................. G04F 10/005 |
| 9,859,901 | B1 | 1/2018 | Chu et al. |
| 10,075,173 | B2 * | 9/2018 | Sarda ............... H03L 7/093 |
| 10,128,858 | B2 | 11/2018 | Goldberg et al. |
| 10,135,452 | B2 | 11/2018 | Cherniak et al. |
| 10,141,941 | B2 | 11/2018 | Petrov |
| 10,185,349 | B2 | 1/2019 | Musunuri et al. |
| 10,193,561 | B2 | 1/2019 | Lesso |
| 10,200,047 | B2 | 2/2019 | Markulic et al. |
| 10,291,214 | B2 | 5/2019 | Thijssen et al. |
| 2007/0085570 | A1 | 4/2007 | Matsuta |
| 2009/0015338 | A1 | 1/2009 | Frey |
| 2009/0219073 | A1 | 9/2009 | Sun et al. |
| 2009/0267664 | A1 | 10/2009 | Uozumi et al. |
| 2011/0234270 | A1 | 9/2011 | Kobayashi |
| 2011/0273210 | A1 | 11/2011 | Nagaraj |
| 2012/0056769 | A1 | 3/2012 | Wang et al. |
| 2012/0161834 | A1 | 6/2012 | Lee et al. |
| 2013/0051290 | A1 | 2/2013 | Endo et al. |
| 2014/0225653 | A1 | 8/2014 | Hara et al. |
| 2014/0266351 | A1 | 9/2014 | Na et al. |
| 2014/0266354 | A1 | 9/2014 | Boo et al. |
| 2015/0077279 | A1 | 3/2015 | Song et al. |
| 2015/0188553 | A1 | 7/2015 | Familia et al. |
| 2015/0372690 | A1 | 12/2015 | Tertinek et al. |
| 2016/0056827 | A1 | 2/2016 | Vlachoginnakis et al. |
| 2016/0156362 | A1 | 6/2016 | Kim et al. |
| 2016/0164532 | A1 | 6/2016 | Zhang et al. |
| 2016/0204787 | A1 | 7/2016 | Lotfy et al. |
| 2016/0238998 | A1 | 8/2016 | Pavlovic et al. |
| 2016/0352506 | A1 | 12/2016 | Huang |
| 2016/0380759 | A1 | 12/2016 | Kondo et al. |
| 2017/0187383 | A1 | 6/2017 | Lesso |
| 2017/0288686 | A1 | 7/2017 | Burg et al. |
| 2018/0269885 | A1 | 9/2018 | Kondo et al. |
| 2018/0351558 | A1 | 12/2018 | Kuo et al. |

FOREIGN PATENT DOCUMENTS

| | | |
|---|---|---|
| JP | H11143570 | 5/1999 |
| JP | 2009260866 | 11/2009 |
| WO | 2015161890 | 10/2015 |

OTHER PUBLICATIONS

Texas Instruments Data Sheet LMK05028 Low-Jitter Dual-Channel Network Synchronizer Clock with EEPROM, Feb. 2018 (94 pages).
International Search Report in corresponding PCT Application No. PCT/US2019/021599 dated May 30, 2019 (2 pages).
International Search Report in corresponding PCT Application No. PCT/US2019/021968 dated Jun. 13, 2019 (2 pages).
International Search Report in corresponding PCT Application No. PCT/US2019/021966 dated Jun. 20, 2019 (2 pages).
International Search Report in corresponding PCT Application No. PCT/US2019/030892 dated Aug. 1, 2019 (3 pages).

* cited by examiner

CRYSTAL OSCILLATOR OFFSET TRIM IN A PHASE-LOCKED LOOP

RELATED APPLICATIONS

This application claims priority to U.S. Provisional Application No. 62/642,039, filed Mar. 13, 2018, which is hereby incorporated by reference.

BACKGROUND

A phase-locked loop (PLL) generates an output clock that the PLL phase locks to an input reference clock. A PLL may include an analog phase-locked loop (APLL) to generate the output clock. The PLL also may include a digital PLL (DPLL). The DPLL includes a time-to-digital converter (TDC) that generates a digital output value that is a function of the phase difference between corresponding edges of the reference clock and a feedback clock derived from the output clock. The digital signal from the TDC is filtered by a digital loop filter and the digital loop filter's output is used to adjust a divide ratio of a frequency divider within the APLL.

SUMMARY

In one example, a phase-locked loop (PLL) includes a time-to-digital converter (TDC) to receive a reference clock. The PLL also includes a digital loop filter coupled to the TDC. The digital loop filter repeatedly generates frequency control words. An analog phase-locked loop (APLL) includes a programmable frequency divider. A non-volatile memory device stores a value from the digital loop filter. The PLL includes a free-run control circuit. Upon a power-on reset process, the free-run circuit retrieves the value from the non-volatile memory to adjust a divide ratio of the programmable frequency divider based on the retrieved value. Upon a reference clock provided to the TDC, the free-run control circuit continues to adjust the divide ratio of the programmable frequency divider based on both the retrieved value from the non-volatile memory and a current frequency control word from the digital loop filter.

In another example, a method includes, upon a power-on reset event of a phase-locked loop (PLL), retrieving a value from non-volatile storage. The method further includes adjusting a divide ratio of a frequency divider using the retrieved value, and then continuing to adjust the divide ratio based on both the retrieved value and current frequency control words generated by a digital loop filter.

BRIEF DESCRIPTION OF THE DRAWINGS

For a detailed description of various examples, reference will now be made to the accompanying drawings in which.

DETAILED DESCRIPTION

As noted above, some PLLs include an APLL and a DPLL. A separate reference clock is provided to each of the APLL and the DPLL, where the reference clock to the DPLL is the reference clock to which the PLL's output clock ultimately is to be phase-locked. After phase-lock is initially achieved to the APLL's reference clock, the output clock from the APLL is then phase-locked to the DPLL's reference clock. The reference clock of the APLL has no particular phase relationship to the reference clock provided to the DPLL. The APLL's reference clock may be provided by a crystal oscillator (XO) and is referred to herein as an XO CLK. The XO CLK is nominally a predetermined frequency, but has some variation from oscillator-to-oscillator. The frequency variation between XO CLK signals is normally offset by the operation of the DPLL. However, that process takes considerable time. The disclosed phase-locked loop (PLL) includes a circuit to nullify the XO CLK offset upon a power-on cycle in significantly less time than would be the case using the DPLL.

Figure 1:
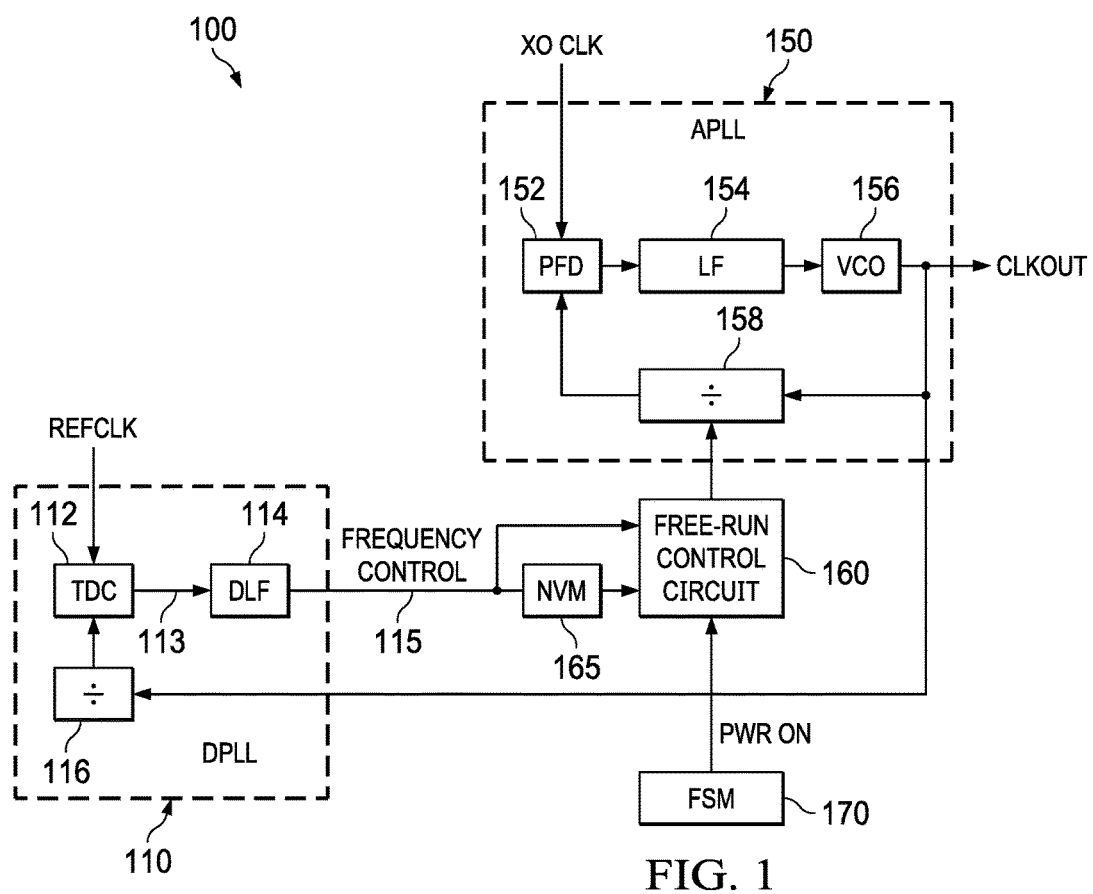
FIG. 1 illustrates an example of a phase-locked loop (PLL) that trims a frequency divider due to offset in a crystal oscillator clock frequency to an analog PLL (APLL) within the PLL.

FIG. 1 includes a schematic of an example PLL 100. PLL 100 in this example includes a DPLL 110 coupled to an APLL 150. The PLL also includes a finite state machine (FSM) 170. The PLL 100 also includes a free-run control circuit 160 coupled to a non-volatile storage device 165. In some examples, the non-volatile storage device 165 comprises a one-time programmable memory, an electrically-erasable programmable read only memory (EEPROM), or other form of non-volatile storage.

The DPLL 110 includes a TDC 112, a digital loop filter (DLF) 114, and a frequency divider 116. The APLL includes a phase-frequency detector (PFD) 152, a loop filter (LF) 154, a voltage-controlled oscillator (VCO) 156, and a programmable frequency divider 158. Programmable frequency divider 158 may be a fractional divider and its divide ratio is programmable. Additional components may be included as well in other examples. The PFD 152 of the APLL 150 detects the phase and/or frequency difference between an XO CLK and a feedback clock (FBCLK1). FBCLK1 is generated by the programmable frequency divider 158 and is a divided down version of the output clock (CLKOUT) from the VCO 156. The PFD 152 generates an error signal to the LP 154 based on the phase and/or frequency difference between XO CLK and FB CLK1. The LP 154 filters the PFD's output error signal. The filtered output from the LP 154 is an analog voltage that is used by the VCO 156 to control the frequency of CLKOUT. The APLL 150 implements a control loop in which CLKOUT is fed back to the PFD 152 via frequency divider 158 and a voltage is generated to adjust the frequency of CLKOUT. As such, the frequency of CLKOUT is continually adjusted, as necessary, to maintain phase lock.

The TDC 112 of the DPLL 110 determines the phase difference between a reference clock (REFCLK) and another feedback clock (FBCLK2). REFLCK is the main reference clock to which CLKOUT is to be phase-locked. FBLCK2 is derived from CLKOUT via frequency divider 116, which may have the same or different divide ratio as the programmable frequency divider 158. Frequency divider 116 may have a fixed divide ratio (i.e., not programmable) or a programmable divide ratio (programmable). The TDC 112 generates a digital correction word 113 corresponding to the phase error between REFCLK and FBCLK2. The correction word 113 is filtered by DLF 114 to produce a frequency control word which is then provided to DLF 114 and used to control the divide ratio of the programmable frequency divider 158 within the APLL 150.

The example PLL architecture of FIG. 1 operates in a two-loop mode. After power-on reset and initialization, the APLL 150 locks the VCO output (CLKOUT) to XO CLK and operates in a "free-run" mode meaning that CLKOUT is locked to XO CLK, but is not locked to REFCLK, and the PLL at this point is not operating to attempt to lock CLKOUT to REFCLK. Then, once REFCLK is supplied to TDC 112, the DPLL 110 enters a lock acquisition mode. The TDC 112 compares the phase of REFCLK to the phase of FBCLK2 and generates the digital correction word 113. After filtering of the digital correction word 113 by DLF 114, the frequency control word 115 can be used to control the divide ratio of the programmable frequency divider 158. The control loop implemented by the DPLL 110 results in phase-lock of CLKOUT to REFCLK.

In some examples, the XO CLK is an externally-supplied clock signal (i.e., external with respect to the semiconductor die containing the PLL 100). The frequency of XO CLK is nominally a predetermined frequency but has some variation from crystal oscillator-to-crystal oscillator. For example, the XO CLK frequency may have an offset variation of 50 parts per million (ppm). The DPLL's control loop achieves phase lock but the phase lock process can take a considerable length of time as noted above. The use of free-run control circuit 160 and NVM 165 considerably reduces the lock acquisition time period. The NVM 165 may be separate from the free-run control circuit 160 or may be part of the free-run control circuit 160.

Following an initial power-on reset event, the frequency control word 115 that is used to achieve phase lock (in controlling the divide ratio of the programmable frequency divider 158) is stored in the NVM 165. The first time the PLL is powered on, after phase lock is achieved, the FSM 170 causes the DLF's frequency control word to be saved to NVM 165. The FSM 170 then sets a flag in NVM 165 to record the fact that the NVM 165 has a valid frequency control word to be used for subsequent power-on reset events. Upon a subsequent power-on reset event (e.g., the next time the device containing the PLL 100 is powered on), rather than allowing the DPLL 110 to spend the time to control the divide ratio of divider 158 to achieve phase-lock, the previously stored frequency control word from the NVM 165 is used to control the divide ratio of the divider 158. As the frequency control word 115 retrieved from the NVM 165 was previously determined based on the XO CLK frequency, the free-running control of the APLL 150 is initially configured (via the divider 158) to account for that particular XO CLK frequency. As such, the DPLL's control loop need not expend the considerable time to slowly lock CLKOUT to REFCLK. The FSM 170 generates a PWR ON control signal to the free-run control circuit 160 to control the operation of the free-run control circuit 160 to use the previously stored frequency control word from the NVM 165 upon a power-on reset event, and then to also use the dynamically generated frequency control words 115 from the DPLL 110 once the DPLL begins its lock process.

Figure 2:
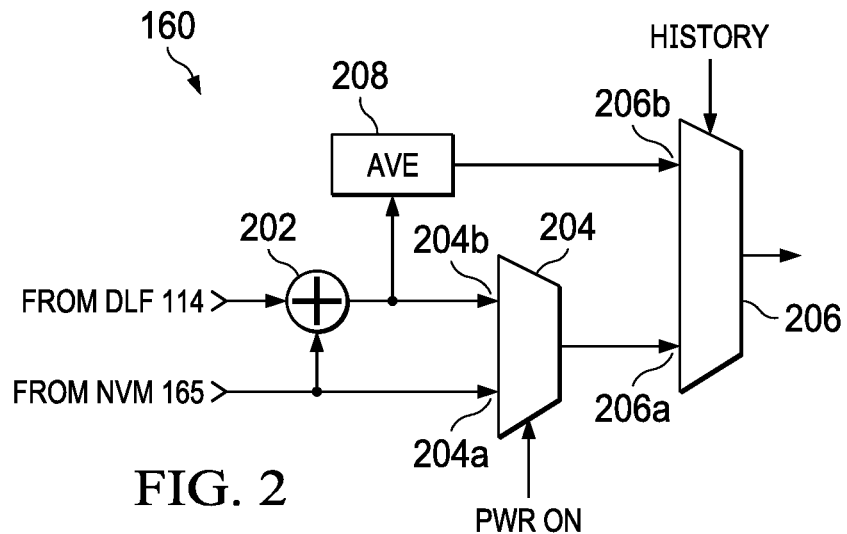
FIG. 2 shows an example of a circuit in the PLL of FIG. 1 that trims the frequency divider.

FIG. 2 shows an example implementation of the free-run control circuit 160. The example free-run control circuit 160 includes an adder 202, multiplexers 204 and 206, and an averager circuit 208. Multiplexer 204 includes an input 204a and an input 204b. Input 204a receives the stored value from the NVM 165. Adder 202 adds the stored value from NVM 165 to the current frequency control word from DLF 114. The output from adder 202 is provided to input 204b of multiplexer 204. The output of adder 202 also is provided to average circuit 208, which determines a running average of the frequency control words used to control the divide ratio of the programmable frequency divider 158.

Multiplexer 206 includes an input 206a and an input 206b. The output from multiplexer 204 is coupled to input 206a of multiplexer 206. The output of averager circuit 208 is coupled to input 206b of multiplexer 206. The control signal to multiplexer 204 is PWR ON and is used to control which of the multiplexer's input signals is provided to its output and thus to input 206a of multiplexer 206. In one state, the PWR ON signal causes the input 204a to be provided to its output and in another state, the PWR ON signal causes input 204b to be provided to its output. During or just after a power-on reset event of the PLL 100, PWR ON is asserted to the state that causes the signal on input 204a to be provided to its output and thus to input 206a of multiplexer 206. That is, the previously stored frequency control word from NVM 165 is provided to input 206a of multiplexer 206, and through multiplexer 206 to configure the divide ratio of the programmable frequency divider 158 of APLL 150. Then, after the DPLL 110 begins to receive a valid REFCLK to its TDC 112, PWR ON is asserted to the opposite logic state to thereby cause the signal on its input 204b to be provided to multiplexer 206. The signal on input 204b is the sum of the previously stored frequency control word from NVM 165 and the current frequency control word 115 generated by the DFL 114 of the DPLL 110. The divide ratio of the frequency divider 158 in the APLL 150 is then adjusted based on both the retrieved value from NVM 165 and the current frequency control word from the DLF 114.

The averager circuit 208 determines a running average of the dynamically generated frequency control words 115 from the DLF 114. The frequency control words 115 may be noisy and thus averaging the words reduces the amount of noise. However, initially following a power-on reset event, no or very few frequency control words 115 will have been generated by the DLF 114. As such, there are no, or an insufficient number of, frequency control words to average together. The HISTORY control signal to multiplexer 206 is asserted (e.g., by the FSM 170) and is set to one logic state to cause the input 206a to be provided to its output when there is an insufficient number of frequency control words from the DLF 114 to be averaged together. In that state of multiplexer 206 (i.e., the output from multiplexer 204 provided through multiplexer 206), the divide ratio of the programmable frequency divider 158 is configured by either the frequency control word retrieved from NVM 165 or, as the DPLL 110 begins its lock process, the divide ratio of the programmable frequency divider 158 is configured by the output of adder 202. Once a sufficient number of frequency control words have been generated by the DLF 114 (e.g., by the FSM 170 waiting a predefined period of time), then the logic state of HISTORY changes to cause the output of the averager circuit 208 to be provided through multiplexer 206 to the programmable frequency divider 158.

Figure 3:
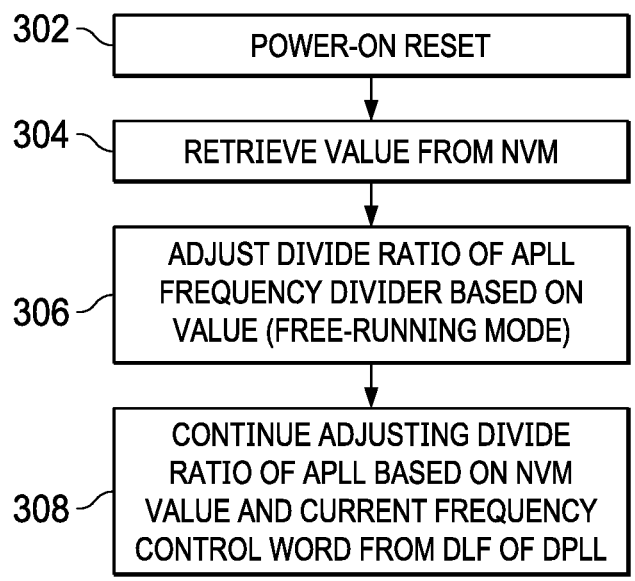
FIG. 3 is an example of a method implemented in the PLL of FIG. 1.

FIG. 3 shows an example of a method. At 302, a power-on reset event occurs and the APLL begins to phase lock CLKOUT to XO CLK in a free-running mode. The previously stored frequency control word from NVM 165 is retrieved and provided to multiplexer 204 as described above. The multiplexers 204 and 206 are configured to provide the NVM's frequency control word to the programmable frequency divider 158. At 306, the method includes adjusting the divide ratio of the APLL's programmable frequency divider using the frequency control word from the NVM 165 (but not based on any frequency control words generated by the DPLL's DLF 114). Once the DPLL receives a REFCLK, the method includes continuing to adjust the divide ratio of the APLL's frequency divider 158 based on both the NVM's frequency control word as well as frequency control words generated by the DPLL's DLF 114

(e.g., based on a sum of the NVM's frequency control word and the frequency control words generated by DLF 114).

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:

1. A phase-locked loop, comprising:
    a time-to-digital converter (TDC) to receive a reference clock;
    a digital loop filter coupled to the TDC, the digital loop filter to repeatedly generate frequency control words;
    an analog phase-locked loop (APLL) including a programmable frequency divider;
    a non-volatile memory device to store a value from the digital loop filter;
    a free-run control circuit to:
        upon a power-on reset process, retrieve the value from the non-volatile memory and adjust a divide ratio of the programmable frequency divider based on the retrieved value; and
        upon the reference clock provided to the TDC, continue to adjust the divide ratio of the programmable frequency divider based on both the retrieved value from the non-volatile memory and a current frequency control word from the digital loop filter.

2. The phase-locked loop of claim 1, wherein the free-run control circuit includes a multiplexer having a first input to receive the value from the non-volatile memory, and having a second input to receive a second value that is based on the value from the non-volatile memory and the current frequency control word from the digital loop filter.

3. The phase-locked loop of claim 2, wherein the free-run control circuit includes an adder to add the value from the non-volatile memory to the current frequency control word from the digital loop filter to generate the second value.

4. The phase-locked loop of claim 1, wherein the free-run control circuit includes an adder to add the value from the non-volatile memory to the current frequency control word from the digital loop filter.

5. The phase-locked loop of claim 1, wherein the value in the non-volatile memory is a frequency control word.

6. The phase-locked loop of claim 1, wherein the free-run control circuit includes an averager circuit to compute a running average of the frequency control words repeatedly generated by the digital loop filter.

7. The phase-locked loop of claim 6, wherein the free-run control circuit includes a multiplexer having:
    a first input to receive the running average from the averager circuit; and
    a second input to receive either the value from the non-volatile memory or a second value that is based on both the retrieved value from the non-volatile memory and the current frequency control word from the digital loop filter.

8. The phase-locked loop of claim 1, wherein the value in the non-volatile memory is a frequency control word previously generated by the digital loop filter.

9. The phase-locked loop of claim 6, wherein the non-volatile memory is to be used to store the value upon a first power-on reset event, but not subsequent power-on reset events.

10. A method, comprising:
    upon a power-on reset event of a phase-locked loop (PLL), retrieving a value from non-volatile storage;
    adjusting a divide ratio of a frequency divider using the retrieved value; and
    continuing to adjust the divide ratio based on both the retrieved value and current frequency control words generated by a digital loop filter.

11. The method of claim 10, wherein retrieving the value from the non-volatile storage comprises retrieving a frequency control word.

12. The method of claim 10, wherein adjusting the divide ratio of the frequency divider comprises adjusting the divide ratio of a frequency divider in an analog PLL (APLL).

13. The method of claim 10, further comprising averaging together frequency control words generated by the digital loop filter to produce an average value, and wherein continuing to adjust the divide ratio includes continuing to adjust the divide ratio based on both the retrieved value and the average value.

14. The method of claim 10, wherein continuing to adjust the divide ratio based on both the retrieved value and current frequency control words includes adding the retrieved value to each of the current frequency control words.

15. A phase-locked loop, comprising:
    a time-to-digital converter (TDC) to receive a reference clock;
    a digital loop filter coupled to the TDC, the digital loop filter to repeatedly generate frequency control words;
    an analog phase-locked loop (APLL) including a programmable frequency divider;
    a non-volatile memory device to store a frequency control word from the digital loop filter; and
    a multiplexer to:
        upon a power-on reset process, provide the frequency control word from the non-volatile memory to the programmable frequency divider; and
        after the power-on reset process, provide a value to the programmable frequency divider, the value based on both the retrieved frequency control word from the non-volatile memory and a current frequency control word from the digital loop filter.

16. The phase-locked loop of claim 15, wherein the value in the non-volatile memory is a frequency control word previously generated by the digital loop filter.

17. The phase-locked loop of claim 15, wherein the non-volatile memory is to be used to store the value upon a first power-on reset event, but not subsequent power-on reset events.

18. The phase-locked loop of claim 15, further including an adder to add the value from the non-volatile memory to the current frequency control word from the digital loop filter.

19. The phase-locked loop of claim 18, wherein the multiplexer includes an input that receives an output of the adder.

20. The phase-locked loop of claim 15, wherein the programmable frequency divider has a divide ratio that is to be programmed based on an output from the multiplexer.

* * * * *